United States Patent [19]

Asano et al.

[11] 4,095,407

[45] Jun. 20, 1978

[54] OSCILLATING AND DIVIDING CIRCUIT HAVING LEVEL SHIFTER FOR ELECTRONIC TIMEPIECE

[75] Inventors: Kazuhiro Asano, Chiba; Kojiro Tanaka, Yachiyo, both of Japan

[73] Assignee: Kabushiki Kaisha Daini Seikosha, Japan

[21] Appl. No.: 702,603

[22] Filed: Jul. 6, 1976

[30] Foreign Application Priority Data

Jul. 9, 1975 Japan .................................. 50-84666

[51] Int. Cl.[2] ........................ G04C 3/00; H03K 17/60

[52] U.S. Cl. .................................... 58/23 R; 58/23 A; 307/247 R; 307/251

[58] Field of Search ............... 58/23 R, 23 A, 23 AC; 307/247 R, 251

[56] References Cited

U.S. PATENT DOCUMENTS 3,948,035 4/1976 Kusumoto ........................... 58/23 R

*Primary Examiner*—Stanley J. Witkowski

*Attorney, Agent, or Firm*—Robert E. Burns; Emmanuel J. Lobato; Bruce L. Adams

[57] ABSTRACT

An oscillation and dividing circuit having a level shifter for an electric timepiece comprises an oscillating circuit, a multi-stage dividing circuit for dividing the frequency of the oscillating circuit and a delay circuit. The outputs of the dividing circuit and the delay circuit are connected through a NAND circuit to the base of a P-FET of the level shifter circuit. The output of the oscillating circuit is connected through an inverter to one input terminal of the first stage of the dividing circuit and through a second inverter to the other input terminal. The output of one stage of the dividing circuit is connected as a control circuit to the delay circuit, thereby supplying a square wave control signal even if the oscillating circuit produces a distorted signal. The pulse width of the pulse applied to the level-shifter is hence constant in spite of poor functioning of the oscillating circuit and a high output voltage is attained.

7 Claims, 9 Drawing Figures

OSCILLATING AND DIVIDING CIRCUIT HAVING LEVEL SHIFTER FOR ELECTRONIC TIMEPIECE

FIELD OF THE INVENTION

This invention concerns an oscillating and dividing circuit having a level shifter for an electronic timepiece and especially relates to an oscillating and dividing circuit for generating a signal having a substantial amplitude for properly operating a high voltage circuit in spite of a change in the oscillating condition of the oscillating circuit.

BACKGROUND OF THE INVENTION

Generally, in an electronic timepiece, the oscillating signal generated by an oscillating circuit is divided by the dividing circuit to obtain the standard time signal which is counted by the counter, whereby the time is displayed by a digital display or by hands employing a stepping motor. Further, the dividing output and a delayed output obtained from delay circuits employed for delaying the dividing output of the dividing circuit are applied to a gate-circuit. A signal of which the period is equal to the period of the dividing output and the pulse width of which is equal to the delay time of said delay circuit is obtained by said gate-circuit, whereby a level-shifter for obtaining the high voltage for operating the high voltage circuit is controlled by the output signal of the gate-circuit.

In an electronic timepiece of the conventional type, the oscillating signal of the oscillating circuit is employed as the control signal of the delay circuit. Accordingly, if the oscillating condition of the oscillating circuit is changed, malfunctioning of the dividing circuit is caused by the change of wave-shape of the oscillating signal from the normal wave to an irregular wave, whereby the pulse width of the output voltage of the level-shifter becomes narrower, so that the output voltage integrated by the suspended capacity does not attain the desired voltage amplitude. In this condition, the switching operation of an inverter disposed in the input side of high voltage circuit is not operated, whereby the high voltage circuit is not operated in spite of the oscillating operation of the oscillating circuit. Thus, a malfunctioning is caused by the change of output of the oscillating circuit.

SUMMARY OF THE INVENTION

It is an object of the present invention to overcome the disadvantages of the conventional circuitry as described above. In accordance with the invention, one input terminal of the first stage of the multistage dividing circuit is connected to the output of the oscillating circuit through an inverter while the other input terminal is connected to the output of the oscillating circuit through the first mentioned inverter and a second inverter connected in series therewith. Moreover, the output of the first stage of the dividing circuit or of a subsequent stage is connected as a control circuit to the delay circuit, thereby supplying to the delay circuit a square wave control signal even if the oscillating circuit produces a distorted signal. The pulse width of the pulse applied to the level shifter is thereby maintained constant in spite of poor functioning of the oscillating circuit and a high output voltage is thereby attained.

BRIEF DESCRIPTION OF THE DRAWINGS

The nature and advantages of the circuitry in accordance with the present invention in comparison with conventional circuitry will be more fully understood from the following description in conjunction with the accompanying drawings, in which.

DESCRIPTION OF THE CONVENTIONAL CIRCUITRY

Figure 1:
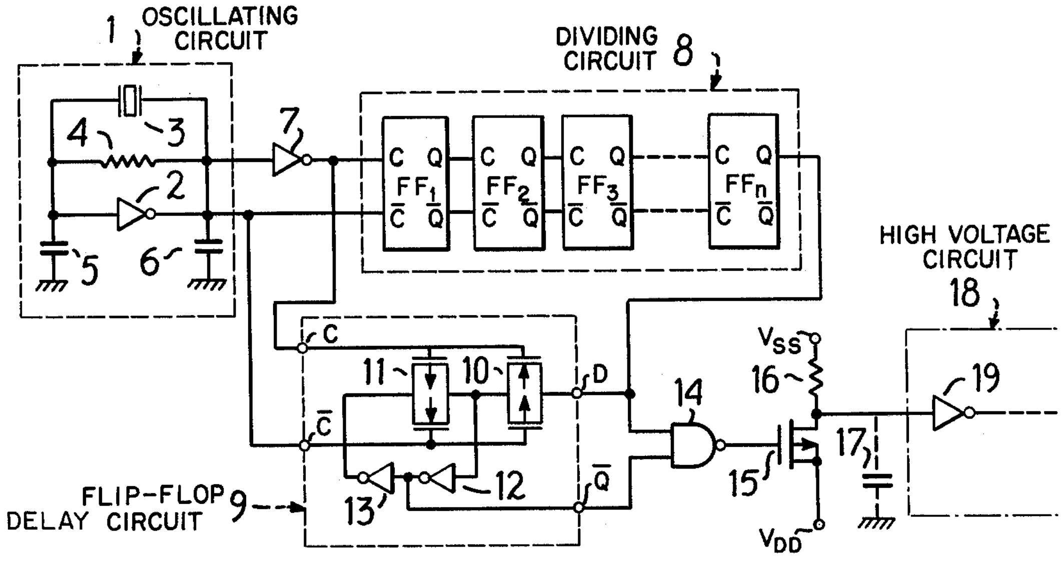
FIG. 1 PRIOR ART
FIG. 1 is a circuit diagram of a conventional oscillating and dividing circuit having a level shifter for an electronic timepiece.

An oscillating and dividing circuit having a level-shifter of the conventional type is shown in FIG. 1. The oscillating circuit 1 comprises an inverter 2, quartz crystal element 3, resistor 4, condenser 5, on which one electrode is connected to ground and the other electrode is connected to the input terminal of the inverter 2, and condenser 6, of which one electrode is connected to ground and the other is connected to the output terminal of the inverter 2. The oscillating signal generated at the output terminal of the inverter 2 of the oscillating circuit 1 is applied to the input of the dividing circuit 8 by an inverter 7. The dividing circuit 8 is composed of a plurality of flip-flop circuits $FF_1$, $FF_2$, $FF_3$. . . FFn for dividing the oscillating signal to the standard time signal. The oscillating signal of oscillating circuit 1 is applied to the input terminal C of the first stage $FF_1$ of the dividing circuit through the inverter 7, while the oscillating signal is directly applied to the input terminal $\bar{C}$. A ½ divided signal is generated from the output terminals Q, $\bar{Q}$ of the first flip-flop circuit $FF_1$, and is applied to the input terminals C, $\bar{C}$ of the second flip-flop circuit $FF_2$ etc., whereby a $\frac{1}{2}n$ divided signal is generated from the final flip-flop circuit FFn.

The D-type flip-flop circuit 9 is employed as the delay circuit. The oscillating output of the oscillating circuit 1 is applied to the input terminal C of the circuit 9 through the inverter 7 while the oscillating output of the oscillating circuit 1 is directly applied to the input terminal $\bar{C}$. The output of the dividing circuit 8 is applied to the data-input terminal D. The D-type flip-flop delay circuit 9 is composed of a transmission gate 10 and a transmission gate 11 each of which is composed of a P-channel FET and an N-channel FET connected in parallel, an inverter 12 and an inverter 13. The output terminals of the transmission-gates 10 and 11 are commonly connected. The input terminal C of the D-type flip-flop delay circuit 9 is connected to N-FET of transmission-gate 10 and P-FET of transmission-gate 11. The input terminal $\bar{C}$ of delay circuit 9 is connected to P-FET of transmission-gate 10 and N-FET of transmission gate 11. The output terminal $\bar{Q}$ of the D-type flip-flop delay circuit 9 is connected to the output side of the inverter 12, whereby the inverted and delayed output signal of said delay circuit 9 is generated.

The outputs of the dividing circuit 8 and the D-type flip-flop circuit 9 are applied to two inputs of a type NAND-gate 14, whereby an output pulse of negative logic of a pulse width equal to the delay time of said flip-flop circuit 9, namely equal to the half-period of the oscillating signal, is obtained.

The output of NAND-gate 14 is applied to the gate of P-FET 15 of the level-shifter; the source of FET 15 is connected to the power supplying terminal VDD, and the drain is connected to the power supplying terminal VSS through the resistor 16. A floating capacitance 17 is connected between the drain of FET 15 and ground. The output of NAND-gate 14 is changed by the FET 15, and is applied to the input of the inverter 19 of the high voltage circuit 18.

In the conventional construction described above, if the wave shape of the oscillating signal is distorted, the duty-ratio is substantially changed. This phenomenon is caused by the loop-gain of the oscillating circuit becoming [1]. Therefore, the distorted signal is applied to the input terminal $\bar{C}$ of the flip-flop circuit $FF_1$, whereby the switching operation of the switching element is not completely operated, the double dividing signal is generated, and further the transmission-gates 10 and 11 of the D-type flip-flop delay circuit 9 are not completely operated.

Figure 2:
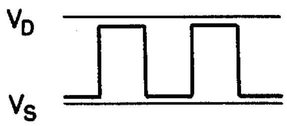
FIG. 2 shows the wave shape of the output signal of the oscillating circuit when in good oscillating condition.
Figure 4:
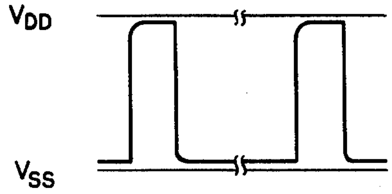
FIG. 4 shows the output wave shape of the level-shifter when the circuitry is in good oscillating condition.

In case of a normal oscillating signal as indicated in FIG. 2, the voltage wave shape generated at the drain of FET 15 of the level-shifter has the maximum amplitude approximately equal to the voltage of the power supplying terminals VDD and VSS as indicated in FIG. 4.

Figure 3:
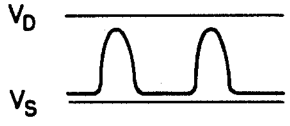
FIG. 3 shows the wave shape of the output signal of the oscillating circuit when in bad operating condition.
Figure 5:
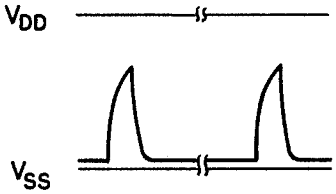
FIG. 5 shows the output wave shape of the level-shifter when the circuitry is in poor oscillating condition.

In case of an abnormal oscillating signal as indicated in FIG. 3, namely a signal with a low duty ratio, the output voltage as integrated by the floating capacitance 17 has a wave shape of which the maximum voltage has a lower level as indicated in FIG. 5. Therefore, the input inverter 19 of the high voltage circuit 18 is not switched, whereby no signal is applied to the high voltage circuit 18.

DESCRIPTION OF THE PREFERRED EMBODIMENT OF THE INVENTION

Figure 6:
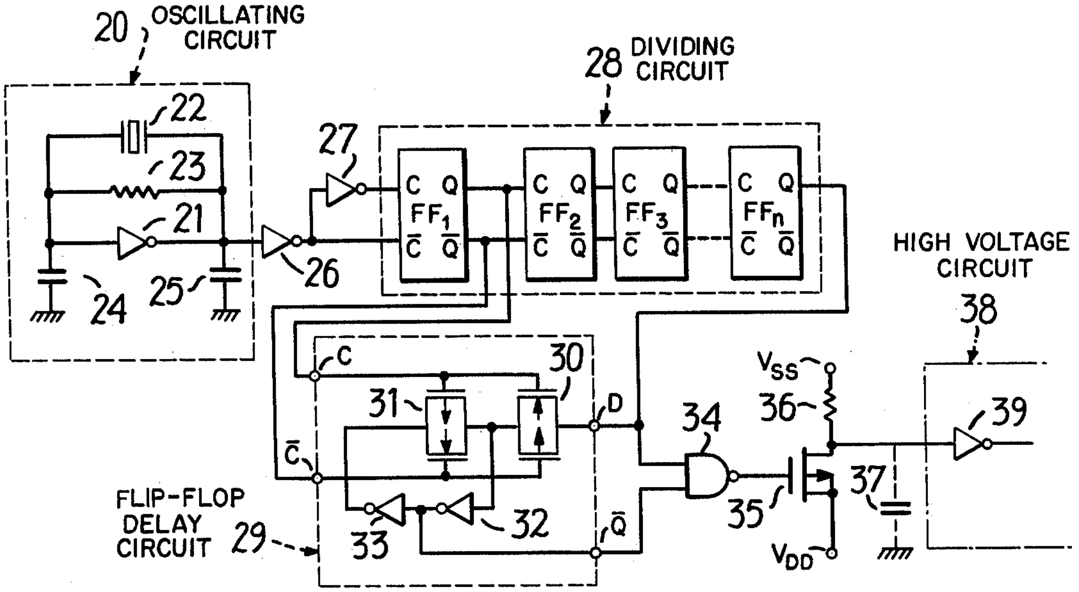
FIG. 6 is a circuit diagram of the oscillating and dividing circuit having a level-shifter for an electronic timepiece in accordance with the present invention.

The present invention aims to eliminate the above noted difficulty and insufficiency. Referring now to the preferred embodiment of the present invention as illustrated in FIG. 6, the oscillating circuit 20 is the same construction as illustrated in FIG. 1 and is composed of the inverter 21, quartz crystal vibrator 22, resistor 23 and condensers 24 and 25, whereby there is generated a signal of a frequency corresponding to the resonance frequency of said quartz crystal vibrator 22. The oscillating signal of the oscillating circuit 20 is inverted by a wave shaping inverter 26, and is applied to the input terminal $\bar{C}$ of the first flip-flop circuit $FF_1$ of the dividing circuit 28 comprising flip-flop circuits $FF_1 \ldots FFn$. Moreover, the inverted signal is further inverted by the second inverter 27 whereby the said oscillating signal is applied to the input terminal C of said flip-flop $FF_1$. If the oscillating frequency of said oscillating circuit 20 is 32,768Hz, the dividing circuit 28 is composed of fifteen stages of flip-flop circuits of a ½ dividing function each, whereby a 1Hz-signal for the standard time signal is generated by dividing circuit 28. A D-type flip-flop delay circuit 29 employed as the delay-circuit is composed of two transmission gates 30 and 31 and two inverters 32 and 33. The divided output from the dividing circuit 28 is applied to the data-input terminal D connected to the input terminal of the transmission gate 30. The output of the first flip-flop circuit $FF_1$ of the dividing circuit 28 is applied to the input terminals C and $\bar{C}$ of the flip-flop delay circuit 29 as the control signal. The divided output of the dividing circuit 28 which is delayed only one half-period from the signal generated at the output terminals Q and $\bar{Q}$ of the flip-flop circuit $FF_1$, namely the control signal applied to the input terminals C and $\bar{C}$, by the delay circuit 29, and the output of the flip-flop delay circuit 29 are applied to the two inputs of a type NAND-gate 34. A pulse of pulse width corresponding to the delay time of the flip-flop delay circuit 29 is generated from NAND-gate 34 in synchronism with the beginning point of the dividing output of the dividing circuit 28. The output pulse of NAND-gate 34 is applied to the base of P-FET 35 comprising the level-shifter. The drain of the FET 35 is connected to the power supplying terminal VSS, the source is connected to the power supplying terminal VDD. A floating capacitance 37 is connected between the drain and ground. The output of level-shifter obtained from the connecting point between the drain of FET 35 and resistor 36 is applied to the input inverter 39 of the high voltage circuit 38.

Figure 7:
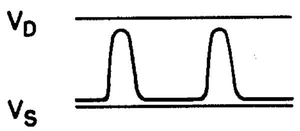
FIG. 7 shows the wave shape of the output signal of the oscillating circuit in bad operating condition.
Figure 8:
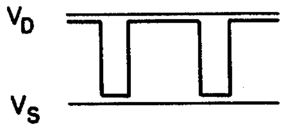
FIG. 8 shows the output wave shape of the inverter of FIG. 6 for shaping the wave in bad operating condition of the oscillating circuit.
Figure 9:
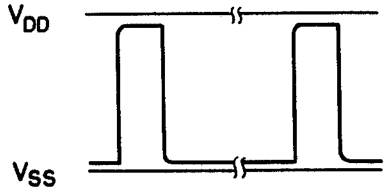
FIG. 9 shows the output wave shape of the level-shifter of FIG. 6 in bad operating condition of the oscillating circuit.

Referring now to the operation of the present invention:

If a distorted oscillating signal as indicated in FIG. 7 is generated by the oscillating circuit 20 by reason of bad oscillating conditions, the wave shape of the output voltage of the wave shaping inverter 26 becomes a complete rectangular wave as shown in FIG. 8. Therefore the flip-flop circuit $FF_1$, in which the oscillating signal shaped by the inverter 26 and the oscillating signal inverted by the inverter 27 are applied to the input terminals $\bar{C}$ and C, respectively, is operated in the normal condition despite the distorted wave shape of the oscillating signal. Further the divided signal of desired frequency is generated by said dividing circuit 28 despite the distorted wave shape of the oscillating output of the oscillating circuit 28. As the complete rectangular wave from flip-flop circuit $FF_1$ of the dividing circuit 28 is applied to the input terminals C and $\bar{C}$ of the D-type flip-flop delay circuit 29 for controlling the delay circuit, the transmission gates 30 and 31 are completety operated. The oscillating signal after ½ dividing by the flip-flop circuit $FF_1$ is very stable in spite of the large change of duty ratio of the oscillating signal of the oscillating circuit 20, and hence a signal having ½ duty ratio is applied to the D-type flip-flop circuit 29. Therefore, the delay time of the D-type flip-flop circuit 29 becomes stabilized. Hence, the output voltage wave shape generated at the connecting point between the drain of FET 35 of the level-shifter and resistor 36 has the maximum amplitude relative to the supplied voltage (VDD and VSS) as indicated in FIG. 9. The input inverter 39 of the high voltage circuit 38 is switched normally without relation of the oscillating condition of said oscillating circuit 20.

The present invention is not limited to the above noted embodiment, as other modifications and improvements are available. For example, instead of the divided signal of one dividing stage being employed as the control signal of the delay circuit as in the above noted embodiment, the output of several dividing steps can be employed as the control signal.

According to the present invention, the dividing output of dividing circuit is delayed by the divided signal in at least one dividing stage as the control signal of the delay circuit, the delayed signal and the dividing output of the dividing circuit are conducted by the gas-circuit, and are applied to the level-shifter, whereby the pulse width of pulse applied to the level-shifter is constant in spite of the distorted wave shape due to bad oscillating conditions of said oscillating circuit, and the wave shape of the output voltage has a substantial large amplitude without relation to the suspended capacitance of output side. It is thus possible to eliminate the trouble in the high voltage circuit caused by poor oscillating conditions of the oscillating circuit.

What we claim is:

1. An oscillating and dividing circuit having a voltage level-shifter for an electronic timepiece comprising in combination: an oscillating circuit for generating an oscillating signal, a multistaged dividing circuit for dividing said oscillating signal to standard time signal, means comprising a first inverter connecting the output of said oscillating circuit with a first input of the first stage of said dividing circuit, means comprising a second inverter connecting the output of said first inverter with a second input of said first stage of the dividing circuit, a delay circuit for delaying a divided output of said dividing circuit, means transmitting the output of a stage of said dividing circuit to said delay circuit as a control signal, a level-shifter circuit including gate means and means connecting the outputs of said dividing circuit and said delay circuit to said gate means of said level-shifter circuit.

2. An oscillator and dividing circuit according to claim 1, in which said means connecting the outputs of said dividing circuit and said delay circuit with said gate means of said level-shifter circuit comprises a NAND gate.

3. An oscillating and dividing circuit according to claim 1, in which said delay circuit is a D-type flip-flop circuit.

4. An oscillating and dividing circuit according to claim 3, in which said D-type flip-flop circuit comprises two transmission gates having a common output and inputs to which said control signal from a stage of said dividing circuit is applied and further comprises an output circuit comprising two inverters connected to the common output of said transmission gates.

5. An oscillating and dividing circuit according to claim 1, in which the output of the first stage of said dividing circuit is connected to said delay circuit to transmit said control signal thereto.

6. An oscillating and dividing circuit having a voltage level-shifter for an electronic timepiece comprising in combination: an oscillating circuit for generating an oscillating signal, a multistage dividing circuit for dividing said oscillating signal to provide a standard time signal, each stage of said dividing circuit comprising a flip-flop circuit, means connecting the input of a first stage of said dividing circuit with the output of said oscillating circuit, a delay circuit for delaying a divided output of said dividing circuit, said delay circuit comprising two transmission gates having a data input, control signal inputs and a common output, means connecting the output of said dividing circuit to the data input of said transmission gates, means connecting the output of a stage of said dividing circuit to the control signal inputs of said transmission gates to transmit the output signal of said stage of the dividing circuit to said delay circuit as a control signal, a level-shifter circuit including gate means, and means connecting the outputs of said dividing circuit and said delay circuit to said gate means of said level-shifter circuit.

7. An oscillating and dividing circuit according to claim 6, in which the output of said first stage of said dividing circuit is connected to said delay circuit to transmit said control signal thereto.

* * * * *